United States Patent
Williams et al.

(10) Patent No.: US 7,027,946 B2
(45) Date of Patent: Apr. 11, 2006

(54) BROADSIDE COMPARE WITH RETEST ON FAIL

(75) Inventors: Randy L. Williams, Denison, TX (US); Glenn R. Fitzgerald, Wylie, TX (US); Michael Henson, Plano, TX (US); Julian I. Gloria, Garland, TX (US); Bruce D. Bishop, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 79 days.

(21) Appl. No.: 10/340,387

(22) Filed: Jan. 10, 2003

(65) Prior Publication Data

US 2003/0141877 A1 Jul. 31, 2003

Related U.S. Application Data

(60) Provisional application No. 60/352,271, filed on Jan. 30, 2002.

(51) Int. Cl.
*G01R 31/28* (2006.01)

(52) U.S. Cl. .................. 702/117; 702/118; 324/761

(58) Field of Classification Search ................ 702/117, 702/58, 59, 79, 118, 124, 125, 177, 185, 189; 324/538, 500, 512, 527, 531, 532, 535, 761, 324/763–765, 73.1, 158.1; 29/593; 438/14, 438/15, 17; 700/121; 714/724; 365/201
See application file for complete search history.

(56) References Cited

U.S. PATENT DOCUMENTS

| | | | | |
|---|---|---|---|---|
| 5,920,573 A * | 7/1999 | Dorney | ...................... | 714/719 |
| 6,043,101 A * | 3/2000 | Stubblefield et al. | ......... | 438/10 |
| 6,061,507 A * | 5/2000 | Fitzgerald et al. | ............. | 716/2 |
| 6,728,652 B1* | 4/2004 | Kobayashi | .................. | 702/117 |
| 2002/0063556 A1* | 5/2002 | Johnson et al. | .......... | 324/158.1 |

* cited by examiner

*Primary Examiner*—Hal Wachsman
(74) *Attorney, Agent, or Firm*—W. James Brady, III; Frederick J. Telecky, Jr.

(57) ABSTRACT

A tester routine is provided that evaluates multiple test pins, on multiple devices under test, at the same time and only if a fail occurs does any evaluation have to be made. In the case of a failing pin on any device only that device with the falling pin is retested until passed or if not passed after a specified time the device is considered a fail.

4 Claims, 1 Drawing Sheet

BROADSIDE COMPARE WITH RETEST ON FAIL

This application claims priority under 35 U.S.C. § 119 (e)(1) of provisional application No. 60/352,271 filed Jan. 30, 2002.

FIELD OF INVENTION

This invention relates to semiconductor chip testing and more particularly to testing in parallel mode multiple pins on one or more devices.

BACKGROUND OF INVENTION

Testers with the ability to test multiple pins of a semiconductor at the same time are known. However, after the readings are stored, the individual device test programs have to evaluate each pins test result one pin at a time. This requires complicated test program evaluation routines to determine if the test passed or failed. With the addition of the ability to test not only multiple pins at one time, but multiple devices at one time, the test evaluation routines become increasingly complex and time consuming, resulting in reduced throughput.

Also because of variations in testers and semiconductor test setups across the world, it has become necessary to construct individual devices test to meet the worse case test condition that may be seen in order to maintain maximum yields. If a particular tester, in a particular country on a particular device, and on a particular device pin, experiences a problem that affects yield, a change is made, to the test program of that device to fix the problem. The change is usually to increase wait times to allow additional time for the problem to settle out. Because the test programs may be used globally, that change will adversely affect every device, using the test program in every lot tested in every test site around the world.

SUMMARY OF INVENTION

In accordance with one embodiment of the present invention a method of testing multiple pins on devices under test includes the steps testing multiple pins on the device at the same time and retesting only devices with failed pins.

In accordance with another one embodiment of the present invention a tester evaluates all test pins, on all devices at the same time, returning a go-no-go result. Only if a fail condition is returned on one of the pins of a device does any evaluation need to be made as to that device. A retest on fail is enabled only as to those devices that have a failed and these devices are retested.

DESCRIPTION OF A PREFERRED EMBODIMENT OF THE PRESENT INVENTION

A tester is provided that evaluates all test pins, on all devices at the same time, returning a go-no-go result. Only if a fail condition is returned does any evaluation need to be made. If the routine indicates that all pins of all devices passed, there is no evaluation required and testing conditions with shorter test time and increased throughput.

Further, the tester instead of adjusting the test programs to meet the worse case test condition that may be encountered, which results in reduced throughput, the specific tester, where the problem occurs, is allowed to adjust to the test problem so that other devices, testing good at other locations, are unaffected. The minimum required test condition is used in the global device test program. If a test problem is encountered on a particular setup, the tester will continue to test that condition until a passing value is returned or until the maximum allowable setup is reached. The problem is corrected down to the specific device, and device pin, without affecting any other device on this same tester or any other tester in the world. This solution reduces test times, increasing throughput, and can also improve yields by allowing the tester to adjust to setup problems.

By combining broadside testing, evaluating all pins of all devices at the same time, with retest-on-fail, a new command is available to increase throughput, increase yields, and reduce device test complexity.

Figure 1:
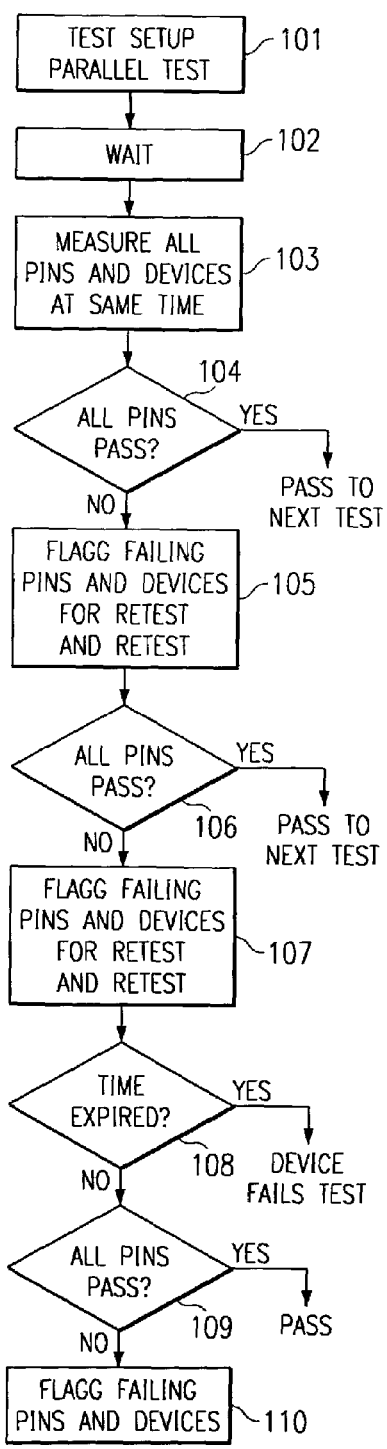
FIG. 1 is a flow chart of the testing procedure according to one embodiment of the present invention.

The operation follows the process of the flow chart of FIG. 1.

The first step 101 is the test setup. The device or, when testing in parallel mode, multiple devices, are setup for an individual test within a device test program, making the required connections and applying the required test conditions to the devices.

The second step 102 is the wait time required to allow all conditions to settle and stabilize.

Figure 2:
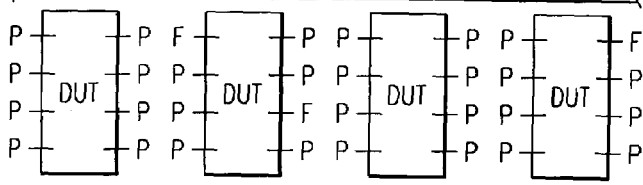
FIG. 2 illustrates four devices under test.

The next step is the measuring step 103. One or more pins, of one or more devices is measured at the same time. Broadside compare refers to testing multiple pins and/or multiple devices at the same time. All pin measurements are compared to the specified test limits all at the same time. FIG. 2 illustrates four devices under test and "P" relates to the pins that pass the test and "F" refers to the pins that fail the test measurement.

Figure 3:
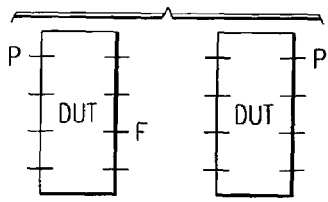
FIG. 3 illustrates two failed devices to be retested.

The next step 104 determines if the all the pins of a device passes the test in a specified retest time that device passes to a new test. If all of the pins of all of the devices pass before a specified retest time is reached, all devices are considered good and testing continues to the next test in the test program. If any or all devices are still returning at least one failing pin after the specified time, those devices that still fail are in step 105 flagged as a failing devices and are flagged for retest. As illustrated by FIG. 3 two devices have failing pins. The flagged devices are retested after a test time.

Figure 4:
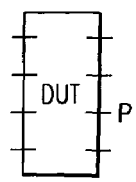
FIG. 4 illustrates one failed device after retest.

The next step 106 determines if all of the pins of the remaining flagged devices pass the test. FIG. 4 illustrates that one of the devices remains a fail. Retesting continues until all specified pins, on all devices, are passing or until the maximum specified retest time is reached. The retesting continues until a maximum specified retest time is reach. If any or all devices that are still returning at least one failing pin after the end of the maximum retest time, those devices are flagged as a failing device and testing stops for those devices. Only the devices that passed all pins continue to the next device test.

In the above example, an initial test cycle is executed followed by two retest cycles. The number of retest cycles will depend on the number of failing pins, the specified retest time for the test, and the speed of the tester. The number of pins and devices tested is dependent on the capability of the tester and test setup.

A sample test code is as follows:

```
*-----------------------------------------------------------------
Label Test-5: ICCL1 3.6
*-----------------------------------------------------------------
Let .pmu V(1,2,3,4)=3.6 V
enable.power
wait 5 ms
compare((1,2,3,4), 0 ma, 10 ma, 10 ms)
```

In this simplified test example, 3.6V, 50 ma is applied to pins 1,2,3,4 of all devices being tested. The test is enabled. A 5 ms required wait time is applied to allow test stabilization. The Broadside Compare statement is executed, measuring pins 1,2,3,4 of all devices being tested, at the same time, comparing them to the limits 0 ma, 10 ma. The comparison will continue until all pins of all devices pass or fail until 10 ms is reached.

What is claimed is:

1. A method of testing multiple pins on multiple devices under test comprising the steps of:
    testing said multiple pins on said multiple devices at the same time with a given test condition;
    passing devices in which all pins pass on each device on a first test; and
    retesting only failed devices with failed pins with said given test condition until all devices pass or until a maximum retest time is reached before continuing to a next test condition and passing devices in which all pins pass on each device within the maximum retest time.

2. The method of claim 1 including repeating retesting on failed devices until a maximum retest time is reached.

3. A method of testing multiple pins on multiple devices under test comprising the steps of:
    making required connections and applying required test conditions to said multiple pins on multiple devices to be tested;
    waiting a required time to allow all conditions to settle and stabilize;
    testing said multiple pins on said multiple devices at the same time with a given test condition after waiting said required time and
    passing devices without failed pins on a first test with said given test condition and retesting only devices with failed pins with said given test condition until all devices pass or until a maximum retest time is reached and passing devices in which all pins pass on each device within the maximum retest time before continuing to a next test condition.

4. The method of claim 3 including repeating retesting on failed devices until a maximum retest time is reached.

* * * * *